US012198959B2

(12) United States Patent
Kim

(10) Patent No.: US 12,198,959 B2
(45) Date of Patent: Jan. 14, 2025

(54) MODULE TRAY FOR SEMICONDUCTOR DEVICE

(71) Applicant: SAMSUNG ELECTRONICS CO., LTD., Suwon-si (KR)

(72) Inventor: Taegeon Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/143,670

(22) Filed: May 5, 2023

(65) Prior Publication Data
US 2024/0128107 A1 Apr. 18, 2024

(30) Foreign Application Priority Data
Oct. 12, 2022 (KR) .......................... 10-2022-0130604

(51) Int. Cl.
*H01L 21/673* (2006.01)
(52) U.S. Cl.
CPC .. *H01L 21/67363* (2013.01); *H01L 21/67356* (2013.01); *H01L 21/67386* (2013.01)
(58) Field of Classification Search
CPC ........... H01L 21/673; H01L 21/673356; H01L 21/673363; H01L 21/673386
USPC ....................................................... 206/707
See application file for complete search history.

(56) References Cited

U.S. PATENT DOCUMENTS

| 4,798,305 | A | * | 1/1989 | Laverty ................. B65D 25/06 |
| | | | | 206/718 |
| 6,606,248 | B2 | | 8/2003 | Matthews et al. |
| 7,014,527 | B2 | * | 3/2006 | Redding ............ G01R 31/2893 |
| | | | | 451/41 |
| 8,844,732 | B2 | | 9/2014 | Wu et al. |
| 9,818,632 | B2 | * | 11/2017 | Lo ..................... H01L 21/67333 |
| 12,037,158 | B2 | * | 7/2024 | Pesaturo ........... H01L 21/67333 |

FOREIGN PATENT DOCUMENTS

| KR | 1995-0002056 A | 1/1995 |
| KR | 1998-0029937 A | 7/1998 |
| KR | 10-0388479 B1 | 6/2003 |
| KR | 10-0567909 B1 | 3/2006 |

* cited by examiner

*Primary Examiner* — Bryon P Gehman
(74) *Attorney, Agent, or Firm* — Muir Patent Law, PLLC

(57) ABSTRACT

A module tray for a semiconductor device includes a base plate, first and second sidewalls extending in a vertical direction from opposite sides of the base plate to define an accommodation space, a dividing wall extending in the vertical direction from the base plate between the first and second sidewalls, first to fourth fastening guides with first to fourth fastening grooves, respectively, on inner surfaces of the first and second sidewalls and opposite side surfaces of the dividing wall, and first to fourth guide grooves on the inner surfaces of the first and second sidewalls and the opposite side surfaces of the dividing wall, respectively, the first to fourth guide grooves having curved concave shapes, and an upper end portion of each of the first to fourth fastening grooves gradually widening toward a top thereof.

20 Claims, 16 Drawing Sheets

MODULE TRAY FOR SEMICONDUCTOR DEVICE

CROSS-REFERENCE TO RELATED APPLICATION

This application claims priority under 35 U.S.C. § 119 to Korean Patent Application No. 10-2022-0130604, filed on Oct. 12, 2022, in the Korean Intellectual Property Office (KIPO), the contents of which are herein incorporated by reference in their entirety.

BACKGROUND

1. Field

Example embodiments relate to a module tray for a semiconductor device. More particularly, example embodiments relate to a module tray for a semiconductor device for accommodating a plurality of semiconductor substrates.

2. Description of the Related Art

A module tray may be used to store and operate a plurality of semiconductor substrates. In order to meet requirements of international standards, process efficiency, etc., a large number of semiconductor substrates need to be transported in one module tray.

SUMMARY

According to example embodiments, a module tray for a semiconductor device includes a base plate, first and second sidewalls extending in a vertical direction from both sides of the base plate to define an accommodation space, a dividing wall extending in the vertical direction from the base plate between the first and second sidewalls to separate the accommodation space into a first space and a second space, first to fourth fastening guides provided on inner surfaces of the first and second sidewalls and both side surfaces of the dividing wall, respectively, the first to fourth fastening guides respectively having first to fourth fastening grooves that extend in the vertical direction to accommodate both ends of a semiconductor substrate, and first to fourth guide grooves provided on the inner surfaces of the first and second sidewalls and the both side surfaces of the dividing wall, respectively, the first to fourth guide grooves having curved concave shapes to respectively guide the semiconductor substrate into the first to fourth fastening guides. An upper end portion of each of the first to fourth fastening grooves gradually widens toward a top.

According to example embodiments, a module tray for a semiconductor device includes a case having an accommodation space that accommodates a semiconductor substrate and a cover detachably fastened on the case to cover the accommodation space. The case includes a base plate, first and second sidewalls extending in a vertical direction from both sides of the base plate to define the accommodation space, a dividing wall extending in the vertical direction from the base plate between the first and second sidewalls to separate the accommodation space, first to fourth fastening guides respectively provided on both side surfaces of the dividing wall and inner surfaces of the first and second sidewalls, the first to fourth fastening guides extending in the vertical direction to accommodate both ends of the semiconductor substrate, the first to fourth fastening guides respectively having first to fourth fastening grooves that gradually widen toward tops, and first to fourth guide grooves respectively provided on the both side surfaces of the dividing wall and the inner surfaces of the first and second sidewalls, the first to fourth guide grooves having curved concave shapes to guide the semiconductor substrate into the first to fourth fastening guides, respectively.

According to example embodiments, a module tray for a semiconductor device includes a case having an accommodation space that accommodates a semiconductor substrate, and a cover detachably fastened on the case to cover the accommodation space. The case includes a base plate, first and second sidewalls extending in a vertical direction from the base plate between the first and second sidewalls to separate the accommodation space into a first space and a second space, the first and second sidewalls having first and second guide grooves that have curved concave shapes on upper surfaces to guide the semiconductor substrate that is inserted in the vertical direction into the accommodation space, a dividing wall extending in the vertical direction from the base plate between the first and second sidewalls to separate the accommodation space, the dividing wall having third and fourth guide grooves that have the curved concave shapes on upper surface to guide the semiconductor substrate that is inserted in the vertical direction into the first and second spaces, respectively, and first to fourth fastening guides respectively provided on both side surfaces of the dividing wall and inner surfaces of the first and second sidewalls, the first to fourth fastening guides extending in the vertical direction to accommodate both ends of the semiconductor substrate, the first to fourth fastening guides respectively having first to fourth fastening grooves that gradually widen toward tops. The first sidewall includes the first number of first reinforcing grooves that are provided on an outer surface of the first sidewall, the first sidewall includes a plurality of first fixing grooves to be combined with or separated from the cover. The second sidewall includes the second number of second reinforcing grooves that are provided on an outer surface of the second sidewall, and the second sidewall includes a plurality of second fixing grooves to be combined or separated from the cover, the second number is different from the first number. The cover includes first and second fixing protrusions protruding from an inner surface and fasten to the first and second fixing grooves, respectively, a first intaglio provided on an upper surface along a label attachment area, and a plurality of second intaglios respectively provided on respective corners of a peripheral area that surrounds the label attaching area, and a support portion protruding from a bottom surface of the cover to support the cover by compensating for a difference between a first height of each of the first and second sidewalls from the base plate and a second height of the dividing wall from the base plate.

According to example embodiments, a module tray for a semiconductor device may include a base plate, first and second sidewalls extending in a vertical direction from both sides of the base plate to define an accommodation space, a dividing wall extending in the vertical direction from the base plate between the first and second sidewalls to separate the accommodation space into a first space and a second space, first to fourth fastening guides provided on inner surfaces of the first and second sidewalls and both side surfaces of the dividing wall, respectively, the first to fourth fastening guides respectively having first to fourth fastening grooves that extend in the vertical direction to accommodate both ends of a semiconductor substrate, and first to fourth guide grooves provided on the inner surfaces of the first and second sidewalls and the both side surfaces of the dividing wall, respectively, the first to fourth guide grooves having curved concave shapes to respectively guide the semiconductor substrate into the first to fourth fastening guides. An upper end portion of each of the first to fourth fastening grooves gradually widens toward a top.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be explained in detail with reference to the accompanying drawings.

Figure 1:
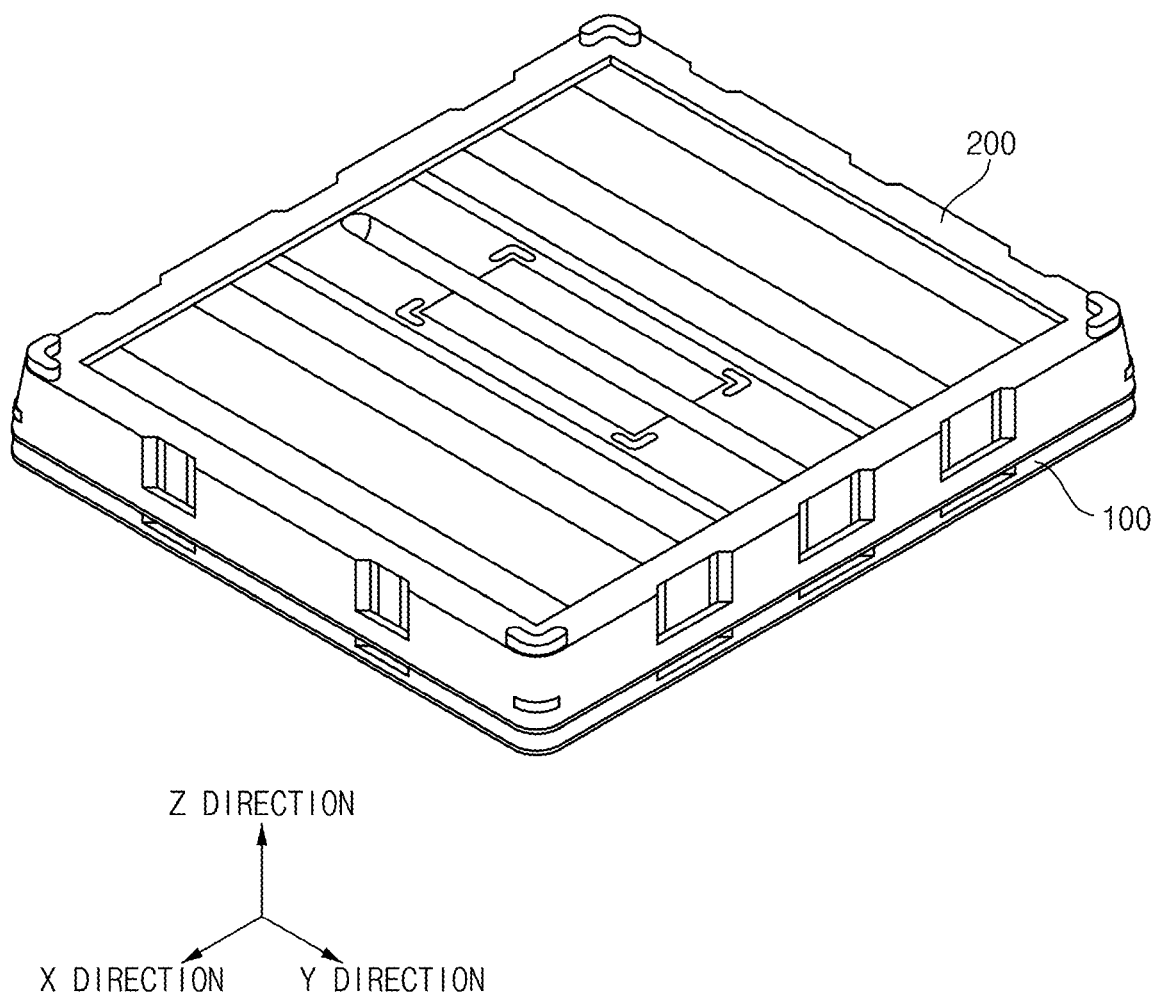
FIG. 1 is a perspective view illustrating a module tray for a semiconductor device in accordance with example embodiments.

FIG. 1 is a perspective view illustrating a module tray for a semiconductor device in accordance with example embodiments.

Referring to FIG. 1, a module tray 10 for a semiconductor device (e.g., a module tray for semiconductor substrates) may include a case 100 configured to accommodate the semiconductor device, and a cover 200 configured to cover the case 100.

In example embodiments, the module tray 10 for the semiconductor device may be a device that is used to stably fix, store and transport the semiconductor device. The module tray 10 for the semiconductor device may protect the semiconductor device from external impacts. The module tray 10 for the semiconductor device may provide a space capable of simultaneously receiving and transporting a plurality of semiconductor devices, e.g., a plurality of semiconductor substrates).

The semiconductor device accommodated in the module tray 10 may include a semiconductor substrate 20 (FIG. 5), e.g., a plurality of semiconductor substrates 20. The semiconductor substrate 20 may be a printed circuit board (PCB) or a substrate on which a semiconductor package manufacturing process is performed. The PCB may be a multilayer circuit board having vias and various circuits therein. For example, the semiconductor substrate 20 may include a Dynamic Random Access Memory (DRAM). For example, the semiconductor substrate 20 may include DDR3, DDR4, DDR5, LPDDR (Low Power Double Data Rate), and the like. The module tray 10 may serve as a carrier that is used in the semiconductor package manufacturing process by loading a plurality of semiconductor substrates 20 therein.

Hereinafter, the case in FIG. 1 will be described in detail with reference to FIGS. 2-9.

Figure 2:
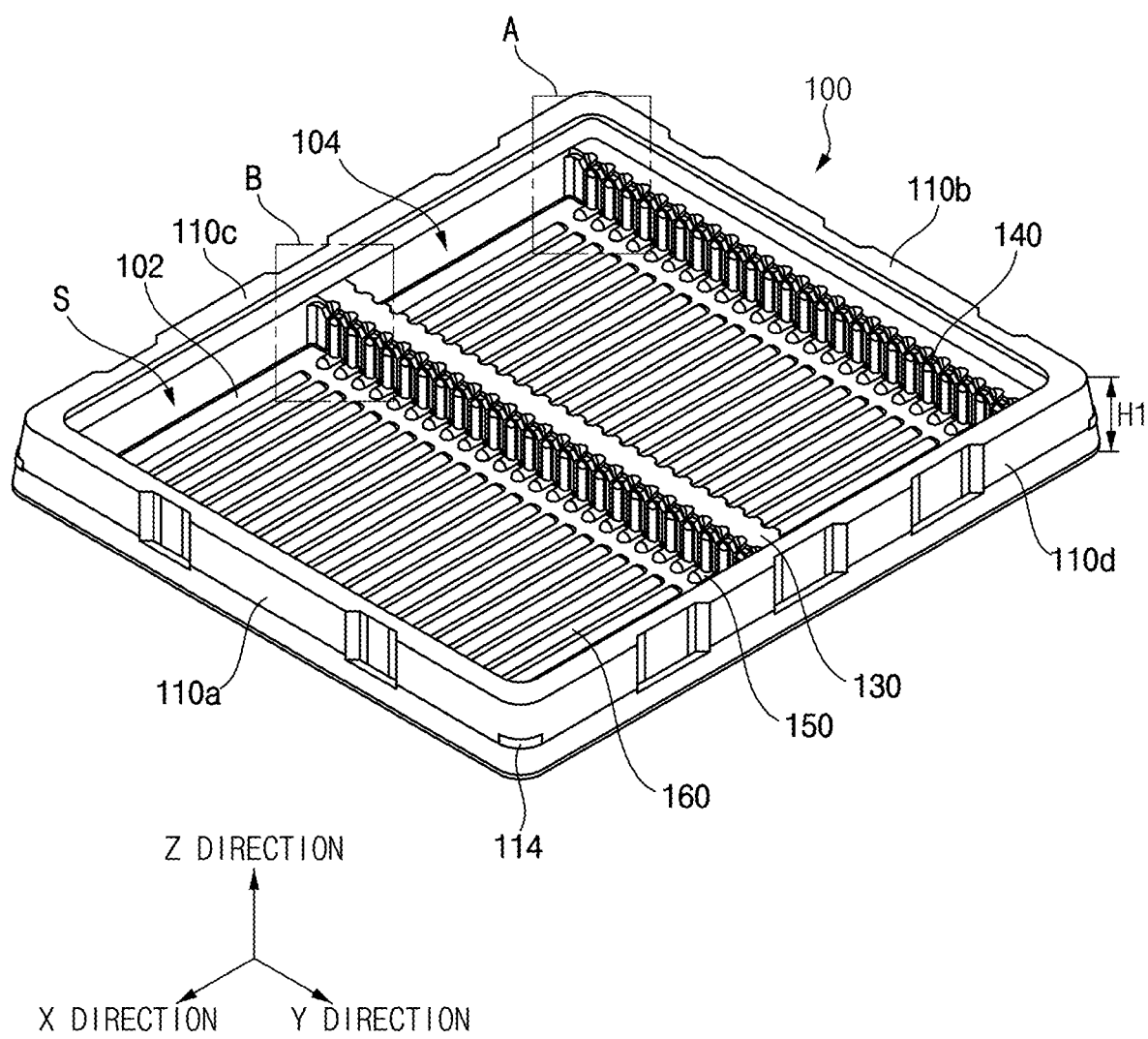
FIG. 2 is a perspective view illustrating a case of a module tray for a semiconductor device in accordance with example embodiments.
Figure 3:
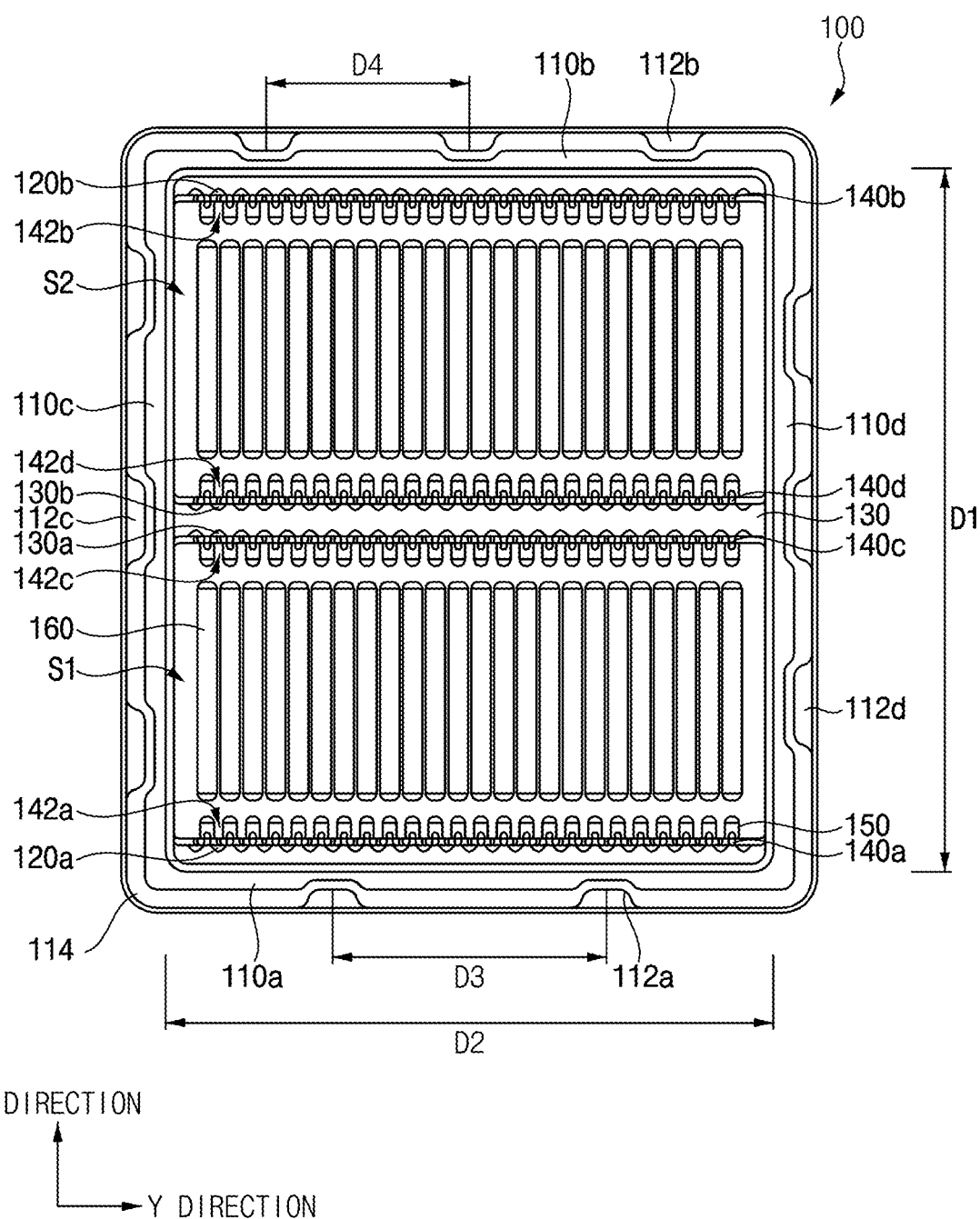
FIG. 3 is a plan view illustrating the case in FIG. 2.
Figure 4:
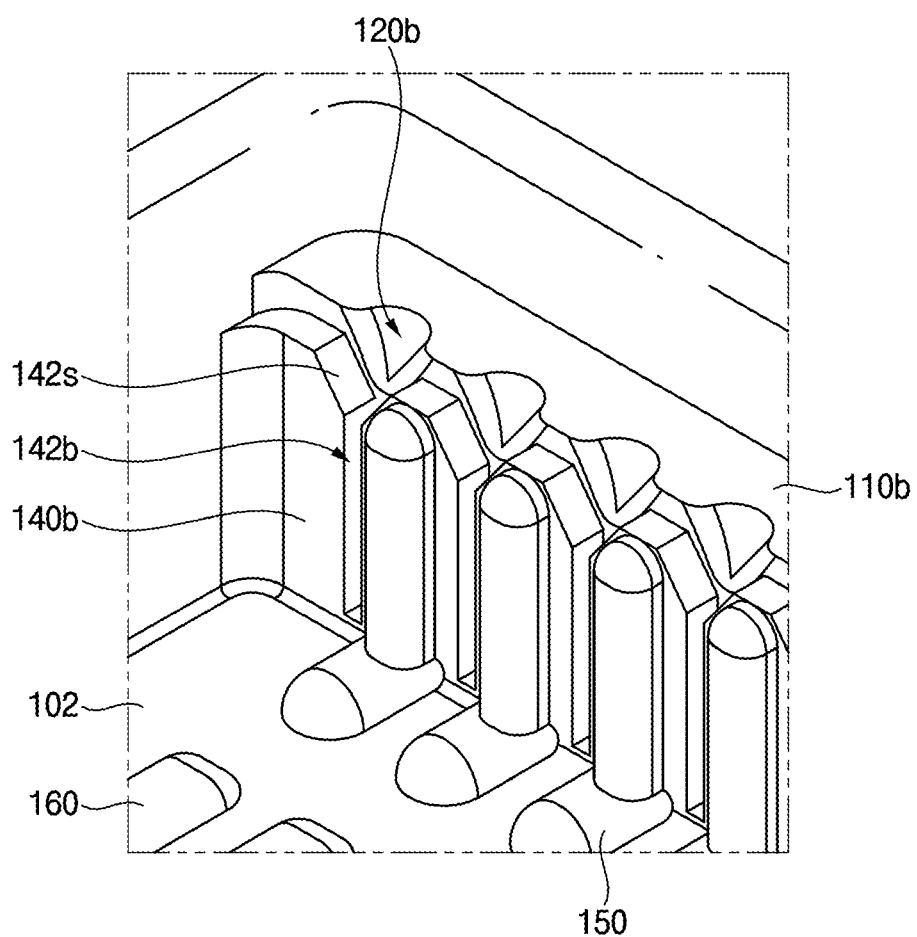
FIG. 4 is an enlarged perspective view illustrating portion 'A' in FIG. 2.
Figure 5:
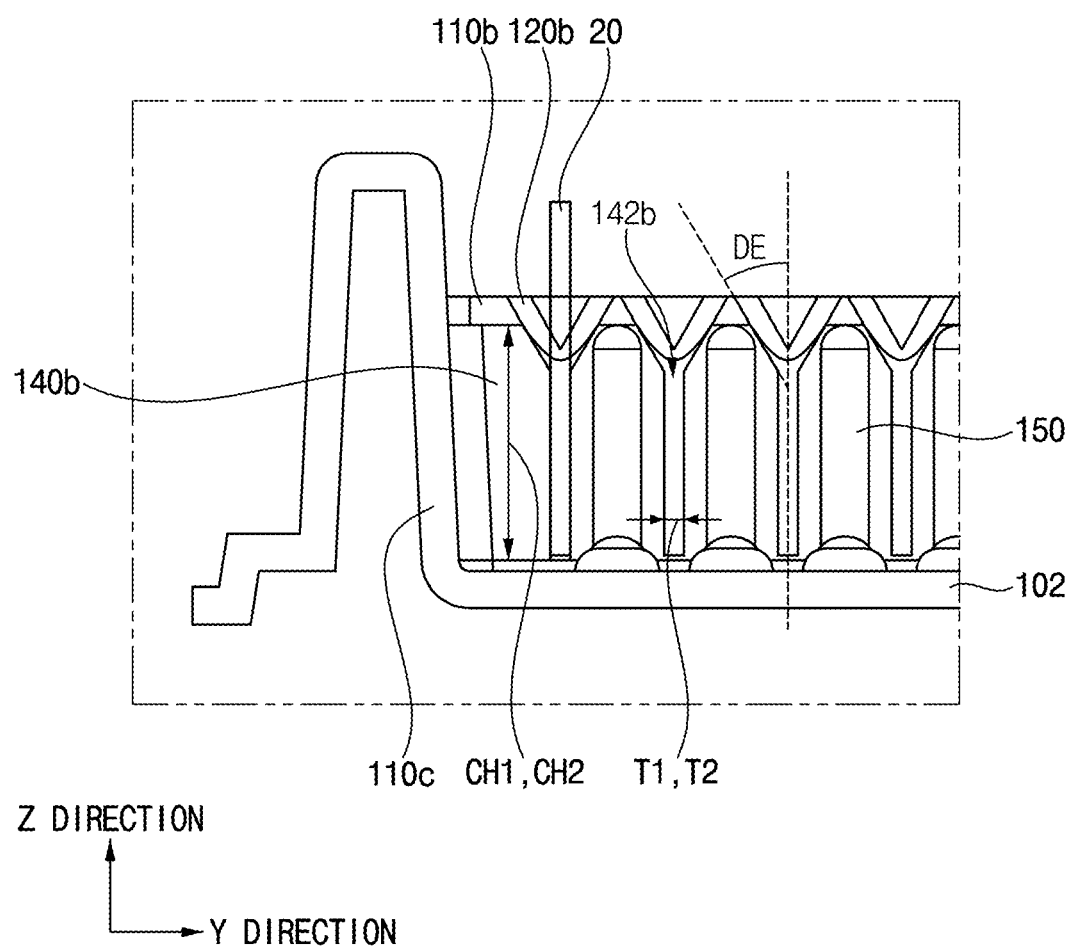
FIG. 5 is an enlarged cross-sectional view illustrating portion 'A' in FIG. 2.
Figure 6:
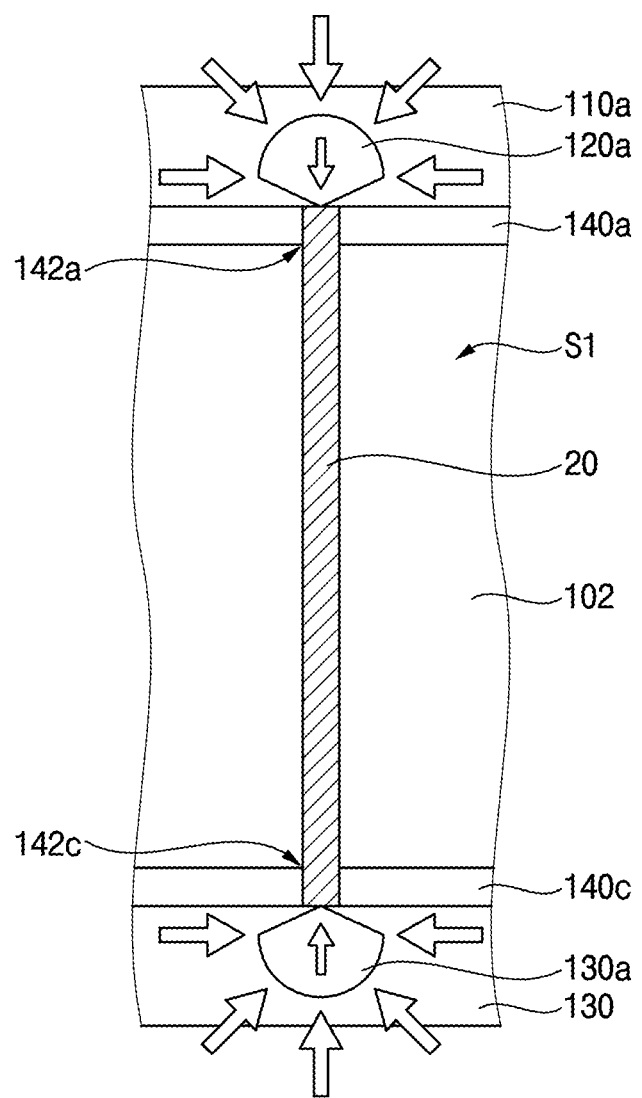
FIG. 6 is a view illustrating directions in which a semiconductor substrate is inserted into an accommodation space.
Figure 7:
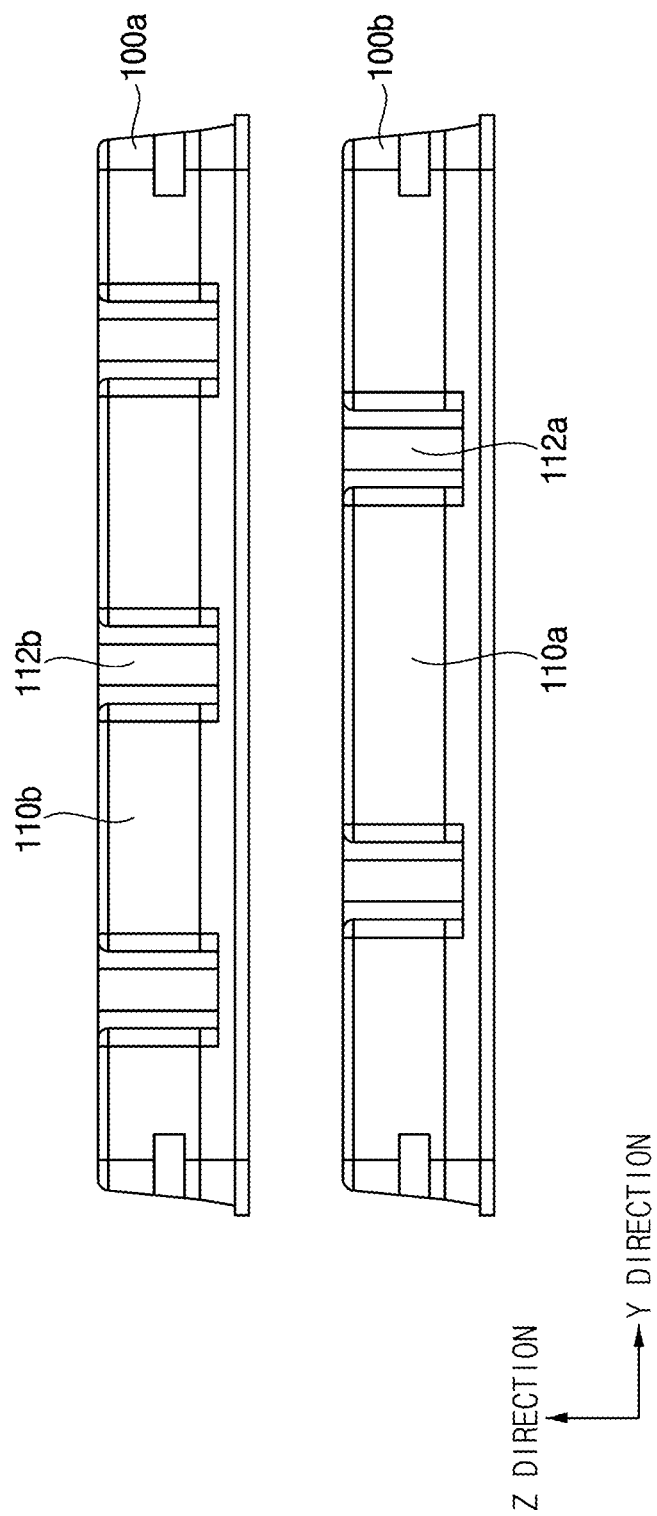
FIG. 7 is a front view illustrating a plurality of stacked cases.
Figure 8:
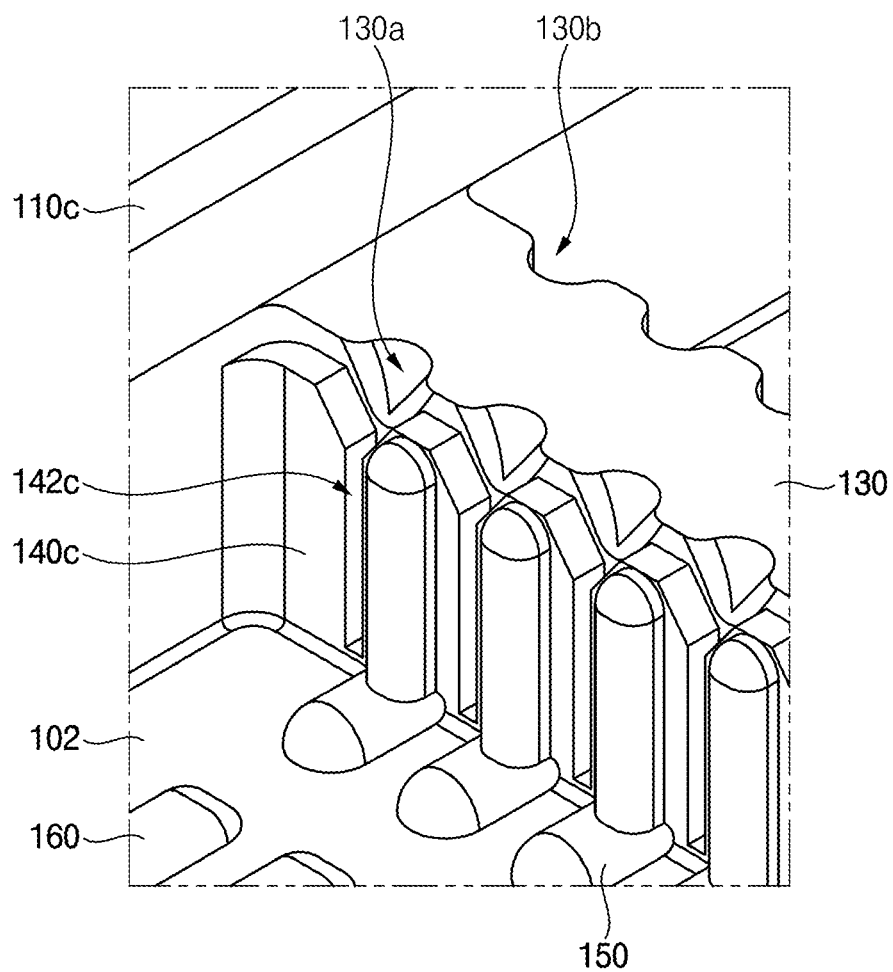
FIG. 8 is an enlarged perspective view illustrating portion 'B' in FIG. 2.
Figure 9:
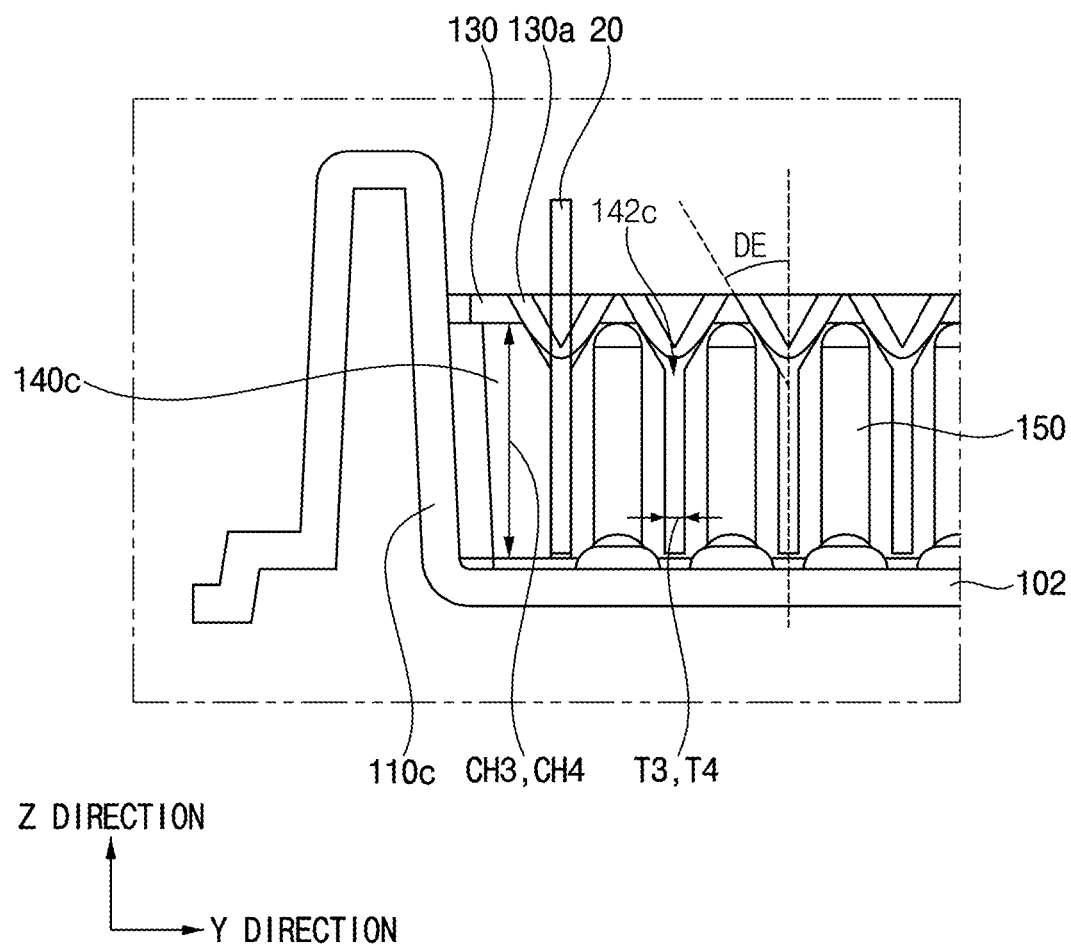
FIG. 9 is an enlarged cross-sectional view illustrating portion 'B' in FIG. 2.

FIG. 2 is a perspective view illustrating the case 100 of the module tray 10 for a semiconductor device in accordance with example embodiments. FIG. 3 is a plan view illustrating the case 100 in FIG. 2. FIG. 4 is an enlarged perspective view illustrating portion 'A' in FIG. 2. FIG. 5 is an enlarged cross-sectional view illustrating portion 'A' in FIG. 2. FIG. 6 is a view illustrating directions in which a semiconductor substrate is inserted into an accommodation space. FIG. 7 is a front view illustrating a plurality of stacked cases. FIG. 8 is an enlarged perspective view illustrating portion 'B' in FIG. 2. FIG. 9 is an enlarged cross-sectional view illustrating portion 'B' in FIG. 2.

Referring to FIGS. 2-9, the case 100 may be shaped as a box having a rectangular parallelepiped shape that has an opened upper surface. The case 100 may include a base plate 102 defining an accommodation space S (e.g., an inner space), first and second sidewalls 110a and 110b facing each other, third and fourth sidewalls 110c and 110d extending between the first and second sidewalls 110a and 110b, and a dividing wall 130 that separates the accommodation space S into a first accommodation space S1 and a second accommodation space S2. The case 100 may have an upper surface opening 104.

The case 100 may accommodate the semiconductor substrate 20 in the accommodation space S. The case 100 may include a plurality of fastening guides 140 configured to accommodate and fixedly support the semiconductor substrate 20 in the accommodation space S, e.g., the plurality of fastening guides 140 may be flat portions arranged adjacent to each other to accommodate and support insertion of the semiconductor substrate 20 therebetween. The fastening guides 140 may include first to fourth fastening guides 140a, 140b, 140c and 140d. The first to fourth fastening guides 140a, 140b, 140c and 140d may be provided on the first and second sidewalls 110a and 110b and the dividing wall 130, respectively. For example, as illustrated in FIG. 3, the first and third fastening guides 140a and 140c may be on the first sidewall 110a and a sidewall of the dividing wall 130 that faces the first sidewall 110a, respectively, such that the first and third fastening guides 140a and 140c may face each other. Similarly, the second and fourth fastening guides 140b and 140d may be on the second sidewall 110b and a sidewall of the dividing wall 130 that faces the second sidewall 110b, respectively, such that the second and fourth fastening guides 140b and 140d may face each other. The first to fourth fastening guides 140a, 140b, 140c and 140d may respectively have first to fourth fastening grooves 142a, 142b, 142c and 142d into each of which the semiconductor substrate 20 is inserted.

The base plate 102 of the case 100 may extend parallel to a ground, e.g., parallel to a bottom of the case 100. The first and second sidewalls 110a and 110b may extend parallel to each other. The third and fourth sidewalls 110c and 110d may extend parallel to each other. The dividing wall 130 may extend parallel to the first and second sidewalls 110a and 110b.

The base plate 102, the first to fourth sidewalls 110a, 110b, 110c and 110d, the dividing wall 130, and the fastening guides 140 of the case 100 may include a same material. For example, the case 100 may include a metal material, e.g., stainless steel (Fe). In another example, the case 100 may include a plastic material, e.g., polyethylene (PE), polypropylene (PP), polystyrene (PS), polyethylene terephthalate (PET), polyamides (PA), polyester (PES), polyvinyl chloride (PVC), polyurethanes (PU), polycarbonate (PC), polyvinylidene chloride (PVDC), etc.

The case 100 may include plastic material or metal material that has strong hardness and high toughness. When the semiconductor substrate 20 is inserted into the case 100, the case 100 may protect the semiconductor substrate 20 accommodated therein from the external impact. In a state that the semiconductor substrate 20 is not accommodated in the case 100, the cases 100 may be individually stored and managed. Since the case 100 has a rectangular parallelepiped structure, a plurality of the cases may be stored in a stacked state.

For example, a first height H1 between the upper surface opening 104 and the base plate 102, e.g., along the Z direction, may be within a range of 50 mm to 400 mm. For example, a first distance D1 between the first sidewall 110a and the second sidewall 110b, e.g., along the X direction, may be greater than a second distance D2 between the third sidewall 110c and the fourth sidewall 110d, e.g., along the Y direction. The first distance D1 between the first sidewall 110a and the second sidewall 110b may be within a range of 300 mm to 600 mm. The second distance D2 between the third sidewall 110c and the fourth sidewall 110d may be within a range of 200 mm to 400 mm.

In this specification, the direction (e.g., the X direction) between the first sidewall 110a and the second sidewall 110b is referred to as a first horizontal direction, a direction (e.g., the Y direction) between the third sidewall 110c and the fourth sidewall 110d is referred to as a second horizontal direction, and a direction (e.g., the Z direction) orthogonal to the first horizontal direction and the second horizontal direction is referred to as a vertical direction.

In example embodiments, the first and second sidewalls 110a and 110b may extend from both sides of the base plate 102 in the vertical direction (e.g., the Z direction) to define the accommodation space S. The first sidewall 110a may include a first guide groove 120a to guide the semiconductor substrate 20 on an upper surface thereof. The first guide groove 120a may have a curved concave shape to guide the semiconductor substrate 20 that is inserted in the vertical direction into the first accommodation space S1. For example, a sidewall of the first guide groove 120a may curve away from the accommodation space S1 toward the first sidewall 110a, e.g., the sidewall of the first guide groove 120a may further continuously curve toward the base plate 102. The first guide grooves 120a may be arranged on the upper surface of the first sidewall 110a along the second horizontal direction.

The first guide groove 120a may guide the semiconductor substrate 20 to the first fastening groove 142a of the first fastening guide 140a. The first guide groove 120a may be provided on the first fastening groove 142a of the first fastening guide 140a. For example, the first guide groove 120a may include a half funnel shape that narrows toward the first fastening groove 142a of the first fastening guide 140a.

As illustrated in FIG. 6, the semiconductor substrate 20 may be inserted between the first fastening guide 140a and the third fastening guide 140c, and may be accommodated in the first accommodation space S1. The semiconductor substrate 20 may be simultaneously inserted into the first and third fastening grooves 142a and 142c of the first and third fastening guides 140a and 140c.

The first guide groove 120a may guide the semiconductor substrate 20 such that the semiconductor substrate 20 is inserted into the first fastening groove 142a. The first guide groove 120a may guide the semiconductor substrate 20 to the first fastening groove 142a through the curved concave shape regardless of an insertion direction of the semiconductor substrate 20. The first fastening groove 142a may prevent a collision of the semiconductor substrate 20 with the first sidewall 110a and/or the first fastening guide 140a during accommodation of the semiconductor substrate 20 in the first accommodation space S1, thereby preventing cracks in the semiconductor substrate 20 (e.g., which could potentially be caused by a collision).

The second guide groove 120b may have a curved concave shape to guide the semiconductor substrate 20 that is inserted in the vertical direction into the second accommodation space S2. The second guide grooves 120b may be arranged on the upper surface of the second sidewall 110b along the second horizontal direction.

The second guide groove 120b may guide the semiconductor substrate 20 to the second fastening groove 142b of the second fastening guide 140b. The second guide groove 120b may be provided on, e.g., above, the second fastening groove 142b of the second fastening guide 140b. For example, as illustrated in FIG. 4, the second guide groove 120b may include a half funnel shape that narrows toward the second fastening groove 142b of the second fastening guide 140b, e.g., the shape of the second guide groove 120b may be identical to that of the first guide groove 120a.

The semiconductor substrate 20 may be inserted between the second fastening guide 140b and the fourth fastening guide 140d, and may be accommodated in the second accommodation space S2. The semiconductor substrate 20 may be simultaneously inserted into the second and fourth fastening grooves 142b and 142d of the second and fourth fastening guides 140b and 140d.

The second guide groove 120b may guide the semiconductor substrate 20 such that the semiconductor substrate 20 is inserted into the second fastening groove 142b. The second guide groove 120b may guide the semiconductor substrate 20 to the second fastening groove 142b through the curved concave shape regardless of the insertion direction of the semiconductor substrate 20. The second fastening groove 142b may prevent a collision of the semiconductor substrate 20 with the second sidewall 110b/or and the second fastening guide 140b during accommodation of the semiconductor substrate 20 in the second accommodation space S2, thereby preventing cracks in the semiconductor substrate 20 (e.g., which could potentially be caused by a collision).

As illustrated in FIG. 3, the first sidewall 110a may have a plurality of first reinforcing grooves 112a that are provided on an outer surface of the first sidewall 110a. The second sidewall 110b may have a plurality of second reinforcing grooves 112b that are provided on an outer surface of the second sidewall 110b. The third and fourth sidewalls 110c and 110d may have a plurality of third and fourth reinforcing grooves 112c and 112d that are provided on outer surfaces of the third and fourth sidewalls 110c 110d, respectively. For example, a third distance D3 between the first reinforcing grooves 112a may be within a range of 60 mm to 120 mm, and a fourth distance D4 between the second reinforcing grooves 112b may be within a range of 60 mm to 120 mm.

The first to fourth reinforcing grooves 112a, 112b, 112c, and 112d may increase stress that is generated in each of the first to fourth sidewalls 110a, 110b, 110c, and 110d. The first to fourth reinforcing grooves 112a, 112b, 112c, and 112d may receive an external force in the vertical direction. The first to fourth reinforcing grooves 112a, 112b, 112c, and 112d may increase the stress by dispersing the external force that is applied to the first to fourth sidewalls 110a, 110b, 110c, and 110d.

The first reinforcing grooves 112a may be provided in a first number in the first sidewall 110a. The second reinforcing grooves 112b may be provided in a second number different from the first number in the second sidewall 110b. For example, when the first number is an odd number, the second number may be an even number. Alternatively, when the first number is an even number, the second number may be an odd number. Each of the first and second numbers may be within a range of 2 to 5.

As illustrated in FIG. 7, different cases 100a and 100b may be stacked in the vertical direction. Since the first number of the first reinforcing grooves 112a and the second number of the second reinforcing grooves 112b are different from each other, the reinforcing grooves of the different cases 100a and 100b may not vertically overlap each other. When the different cases 100a and 100b are stacked in opposite directions, e.g., with non-overlapping reinforcing grooves, the different cases 100a and 100b may be stacked without pinching, e.g., engaging or entangling with, each other through the first and second reinforcing grooves 112a and 112b.

In example embodiments, the case 100 may further include a plurality of fixing grooves 114. The case 100 may be combined with or separated from the cover 200 through the fixing grooves 114. The fixing grooves 114 may be combined with or separated from the fixing protrusions 210 (FIG. 13) that are provided on an inner surface of the cover.

As illustrated in FIG. 2, the fixing grooves 114 may be provided on the outer surfaces of the first to fourth sidewalls 110a, 110b, 110c, and 110d. The fixing grooves 114 may be provided at respective corners where the first to fourth sidewalls 110a, 110b, 110c, and 110d extend to each other. The fixing grooves 114 may be provided at positions on the outer surface of the case 100 that correspond to fixing protrusions 210 on the cover 200. The case 100 and the cover 200 may be combined to or separated from each other through fixing protrusions 210 and fixing grooves 114.

In example embodiments, the dividing wall 130 may extend between the first and second sidewalls 110a and 110b in parallel with the first and second sidewalls 110a and 110b. The dividing wall 130 may extend in the vertical direction from the base plate 102 between the first and second sidewalls 110a and 110b. The dividing wall 130 may divide the accommodation space S into the first accommodation space S1 and the second accommodation space S2.

The dividing wall 130 may include the third and fourth guide grooves 130a and 130b to guide the semiconductor substrate 20 that is inserted in the vertical direction to the first and second accommodation spaces S1 and S2, respectively. The third and fourth guide grooves 130a and 130b may be provided on an upper surface of the dividing wall 130.

The third and fourth guide grooves 130a and 130b may be provided in opposite directions. The third guide groove 130a may be provided toward the first guide groove 120a of the first sidewall 110a, e.g., the third guide groove 130a may face the first guide groove 120a. The fourth guide groove 130b may be provided toward the second guide groove 120b of the second sidewall 110b, e.g., the fourth guide groove 130b may face the second guide groove 120b.

The third guide groove 130a may have the curved concave shape to guide the semiconductor substrate 20 that is inserted in the vertical direction into the first accommodation space S1. The third guide grooves 130a may be arranged on a one side of the dividing wall 130 along the second horizontal direction.

The third guide groove 130a may guide the semiconductor substrate 20 to the third fastening groove 142c of the third fastening guide 140c. The third guide groove 130a may be provided on the third fastening groove 142c of the third fastening guide 140c. For example, the third guide groove 130a may include the half funnel shape that narrows toward the third fastening groove 142c of the third fastening guide 140c.

The semiconductor substrate 20 may be inserted between the first fastening guide 140a and the third fastening guide 140c, and may be accommodated in the first accommodation space S1. The semiconductor substrate 20 may be simultaneously inserted into the first and third fastening grooves 142a and 142c of the first and third fastening guides 140a and 140c.

The third guide groove 130a may guide the semiconductor substrate 20 such that the semiconductor substrate 20 is inserted into the third fastening groove 142c. The third guide groove 130a may guide the semiconductor substrate 20 to the third fastening groove 142c through the curved concave shape regardless of the insertion direction of the semiconductor substrate 20. The third guide groove 130a may prevent a collision of the semiconductor substrate 20 with the third sidewall 110c and the third fastening guide 140c, while the semiconductor substrate 20 is accommodated in the first accommodation space S1.

The fourth guide groove 130b may have the curved concave shape to guide the semiconductor substrate 20 that is inserted in the vertical direction into the second accommodation space S2. The fourth guide grooves 130d may be arranged on another side opposite to the one side of the dividing wall 130 along the second horizontal direction.

The fourth guide groove 130b may guide the semiconductor substrate 20 to the fourth fastening groove 142d of the fourth fastening guide 140d. The fourth guide groove 130b may be provided on the fourth fastening groove 142d of the fourth fastening guide 140d. For example, the fourth guide groove 130b may include the half funnel shape that narrows toward the fourth fastening groove 142d of the fourth fastening guide 140d.

The semiconductor substrate 20 may be inserted between the second fastening guide 140b and the fourth fastening guide 140d, and may be accommodated in the second accommodation space S2. The semiconductor substrate 20 may be simultaneously inserted into the second and fourth fastening grooves 142b and 142d of the second and fourth fastening guides 140b and 140d.

The fourth guide groove 130b may guide the semiconductor substrate 20 such that the semiconductor substrate 20 is inserted into the fourth fastening groove 142d. The fourth guide groove 130b may guide the semiconductor substrate 20 to the fourth fastening groove 142d through the curved concave shape regardless of the insertion direction of the semiconductor substrate 20. The fourth guide groove 130b may prevent the collision of the semiconductor substrate 20 with the third sidewall 110c and the fourth fastening guide 140d, while the semiconductor substrate 20 is accommodated in the second accommodation space S2.

In example embodiments, the case 100 may include the fastening guides 140 to fix the accommodated semiconductor substrate 20. The fastening guides 140 may include the first to fourth fastening guides 140a, 140b, 140c, and 140d.

The first to fourth fastening guides 140a, 140b, 140c, and 140d may be provided on the first and second sidewalls 110a and 110b and the dividing wall 130, respectively. The first fastening guide 140a may extend along an inner surface of the first sidewall 110a. The second fastening guide 140b may extend along an inner surface of the second sidewall 110b. The third and fourth fastening guides 140c and 140d may extend along both side surfaces, e.g., opposite side surfaces, of the dividing wall 130, respectively.

The first fastening guide 140a may include a plurality of the first fastening grooves 142a into which the semiconductor substrate 20 is inserted and fixed. The plurality of the first fastening grooves 142a may be spaced apart from each other on an inner surface of the first fastening guide 140a along the second horizontal direction (FIG. 3). The first fastening groove 142a may extend from the inner surface of the first fastening guide 140a in the vertical direction that is orthogonal to the second horizontal direction. The first fastening groove 142a may extend from the upper surface opening 104 to the base plate 102.

The first fastening groove 142a may be provided in the first accommodation space S1. The first fastening groove 142a may be provided below the first guide groove 120a. The first fastening groove 142a may receive the semiconductor substrate 20 from the first guide groove 120a.

The second fastening guide 140b may include a plurality of the second fastening grooves 142b into which the semiconductor substrate 20 is inserted and fixed. The plurality of second fastening grooves 142b may be spaced apart from each other on an inner surface of the second fastening guide 140b along the second horizontal direction (FIG. 4). The second fastening groove 142b may extend from the inner surface of the second fastening guide 140b in a vertical direction that is orthogonal to the second vertical direction. The second fastening groove 142b may extend from the upper surface opening 104 to the base plate 102.

The second fastening groove 142b may be provided in the second accommodation space S2. The second fastening groove 142b may be provided below the second guide groove 120b. The second fastening groove 142b may receive the semiconductor substrate 20 from the second guide groove 120b.

The third fastening guide 140c may include a plurality of the third fastening grooves 142c into which the semiconductor substrate 20 is inserted and fixed. The plurality of the third fastening grooves 142c may be spaced apart from each other on an inner surface of the third fastening guide 140c along the second horizontal direction. The third fastening groove 142c may extend from the inner surface of the third fastening guide 140c in a vertical direction that is orthogonal to the second horizontal direction. The third fastening groove 142c may extend from the upper surface opening 104 to the base plate 102.

The third fastening groove 142c may be provided in the first accommodation space S1. The third fastening groove 142c may be provided below the third guide groove 130a. The third fastening groove 142c may receive the semiconductor substrate 20 from the third guide groove 130a. The third fastening groove 142c may be positioned to face the first fastening groove 142a. The third fastening groove 142c and the first fastening groove 142a may accommodate the one semiconductor substrate 20, together.

The fourth fastening guide 140d may include a plurality of the fourth fastening grooves 142d into which the semiconductor substrate 20 is inserted and fixed. The plurality of the fourth fastening grooves 142d may be spaced apart from each other on the inner surface of the fourth fastening guide 140d along the second horizontal direction. The fourth fastening groove 142d may extend from the inner surface of the fourth fastening guide 140d in a vertical direction that is orthogonal to the second horizontal direction. The fourth fastening groove 142d may extend from the upper surface opening 104 to the base plate 102.

The fourth fastening groove 142d may be provided in the second accommodation space S2. The fourth fastening groove 142d may be provided below the fourth guide groove 130b. The fourth fastening groove 142d may receive the semiconductor substrate 20 from the fourth guide groove 130b. The fourth fastening groove 142d may be positioned to face the second fastening groove 142b. The fourth fastening groove 142d and the second fastening groove 142b may accommodate the one semiconductor substrate 20, together.

The same number of first fastening grooves 142a and third fastening grooves 142c may be provided in the first fastening guide 140a and the third fastening guide 140c, respectively. The first fastening groove 142a and the third fastening groove 142c may face each other and correspond to each other, e.g., in a one-to-one correspondence, to support both ends of the one semiconductor substrate 20, e.g., support opposite ends of a same semiconductor substrate 20. For example, the number of each of the first fastening grooves 142a and the third fastening grooves 142c may be within a range of 20 to 30. The first and third fastening grooves 142a and 142c may include a plastic material or a metal material.

Referring to FIGS. 5 and 9, a first width T1 of the first fastening groove 142a and a third width T3 of the third fastening groove 142c may be equal to each other at a location that exposes to the first accommodation space S1. A first fastening height CH1 in the vertical direction of the first fastening groove 142a and a third fastening height CH3 in the vertical direction of the third fastening groove 142c may be equal to each other. The first fastening height CH1 of the first fastening groove 142a and the third fastening height CH3 of the third fastening groove 142c may be within a range of 40 mm to 300 mm.

The same number of second fastening grooves 142b and fourth fastening grooves 142d may be provided in the second fastening guide 140b and the fourth fastening guide 140d, respectively. The second fastening groove 142b and the fourth fastening groove 142d facing each other and corresponding to each other, e.g., in a one-to-one correspondence, may support one semiconductor substrate 20 at both ends of the one semiconductor substrate 20, e.g., may support opposite ends of a same semiconductor substrate 20. For example, the number of each of the second fastening grooves 142b and the fourth fastening grooves 142d may be within a range of 20 to 30. The second and fourth fastening grooves 142b and 142d may include a plastic material or a metal material.

A second width T2 of the second fastening groove 142b and a fourth width T4 of the fourth fastening groove 142d may be equal to each other at a location that exposes to the second accommodation space S2. A second fastening height CH2 in the vertical direction of the second fastening groove 142b and a fourth fastening height CH2 in the vertical direction of the fourth fastening groove 142d may be equal to each other. The second fastening height CH2 of the second fastening groove 142b and the fourth fastening height CH4 of the fourth fastening groove 142d may be within a range of 40 mm to 300 mm.

For example, the number of each of the first to fourth fastening grooves 142a, 142b, 142c, and 142d may be within a range of 20 to 30. The number of semiconductor substrates 20 capable of being accommodated in the first accommodation space S1 through the first and third fastening grooves 142a and 142c may be within a range of 20 to 30. The number of semiconductor substrates 20 capable of being accommodated in the second accommodation space S2 through the second and fourth fastening grooves 142b and 142d may be within a range of 20 to 30. The total number of semiconductor substrates 20 capable of being accommodated in the accommodation space S of the case 100 may be within a range of 40 to 60.

An upper end portion of each of the first to fourth fastening grooves 142a, 142b, 142c and 142d may gradually, e.g., gently and continuously, widen toward a top. For example, as illustrated in FIG. 5, the second fastening groove 142b may have a first portion having a linear shape with a constant width, and a second portion, i.e., the upper end portion, that extends continuously from the first portion and has a gradually increasing width toward the top, e.g., a length of the linear portion of the first portion in the vertical direction may be larger than a length of the second portion in the vertical direction. The upper end portion of each of the first to fourth fastening grooves 142a, 142b, 142c and 142d may have side surfaces that are inclined at a predetermined angle DE with respect to the vertical direction to guide the semiconductor substrate 20. The semiconductor substrate 20 may be inserted into the first to fourth fastening grooves 142a, 142b, 142c and 142d through the inclined side surfaces.

The inclined side surfaces of each of the first to fourth fastening grooves 142a, 142b, 142c and 142d may be provided below the first to fourth guide grooves 120a, 120b, 130a, and 130b, respectively. For example, as illustrated in FIG. 4, an inclined side surface 142s of the second fastening groove 142b may be adjacent to the second guide groove 120b. The inclined side surfaces of each of the first to fourth fastening grooves 142a, 142b, 142c and 142d may receive the semiconductor substrate 20 from each of the first to fourth guide grooves 120a, 120b, 130a, and 130b. For example, the predetermined angle DE may be within a range of 20 degrees to 40 degrees.

In example embodiments, the case 100 may further include a plurality of ribs 150. Each of the ribs 150 may protrude from a front surface of each of the first to fourth fastening guides 140a, 140b, 140c, and 140d, e.g., between adjacent fastening grooves, and extend perpendicularly along an upper surface of the base plate 102, e.g., each rib 150 may have an L-shape. The plurality of ribs 150 may prevent warpage that occurs inside the case 100.

In example embodiments, the case 100 may further include a plurality of substrate support guides 160 that protrude from the base plate 102, e.g., each substrate support guide 160 may have a linear shape along the base plate 102 that extends in the first direction (e.g., the X direction) and bulges out of the base plate 102. The semiconductor substrate 20 may be inserted between a pair of the adjacent substrate support guides 160. The semiconductor substrate 20 may be fixed inside the case 100 through the first to fourth fastening grooves 142a, 142b, 142c, and 142d and the substrate support guides 160.

The substrate support guides 160 may be spaced apart from each other in the second horizontal direction on the base plate 102. The substrate support guide 160 may extend in the first horizontal direction. The substrate support guides 160 may be provided between the first and third fastening grooves 142a and 142c and the second and fourth fastening grooves 142b and 142d, respectively. For example, the substrate support guides 160 may include a plastic material or a metal material.

Figure 10:
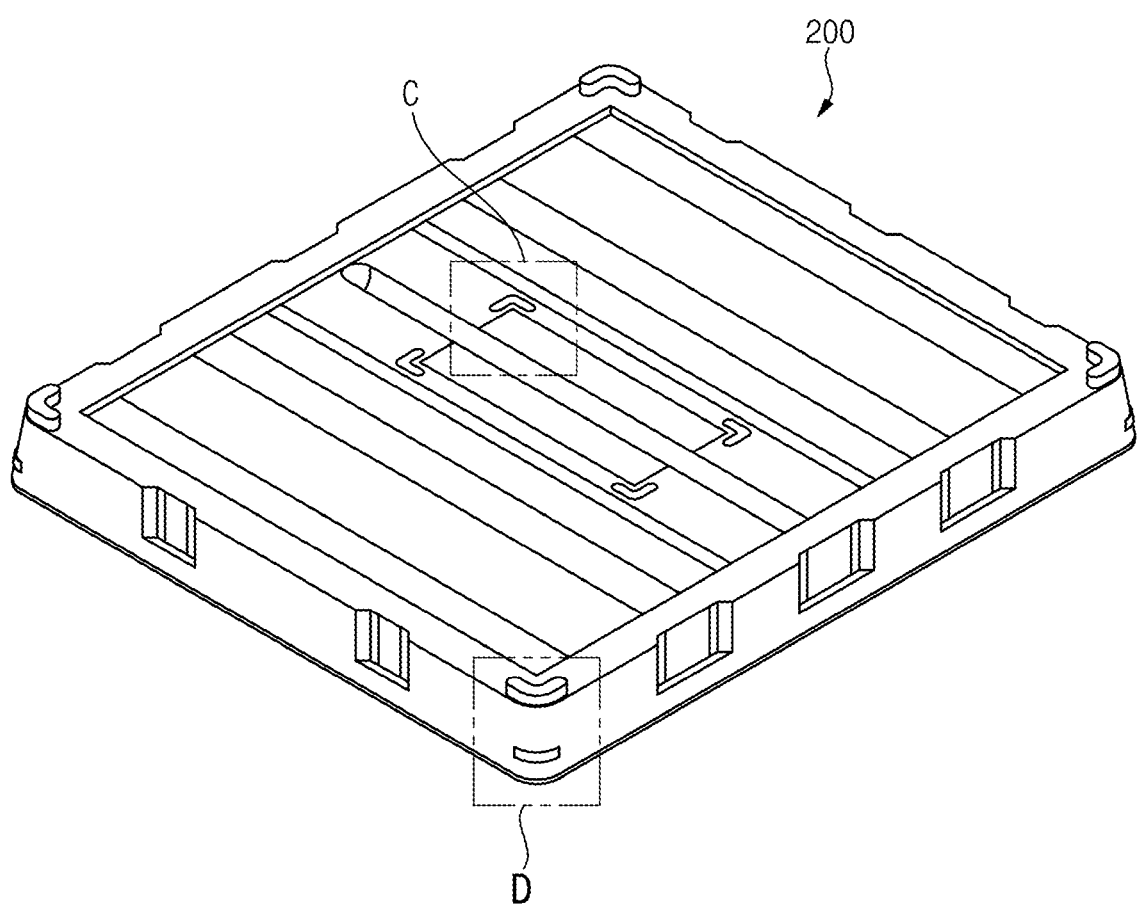
FIG. 10 is a perspective view illustrating a cover of a module tray for a semiconductor device in accordance with example embodiments.

Hereinafter, the cover 200 in FIG. 1 will be described in detail with reference to FIG. 10. FIG. 10 is a perspective view illustrating the cover 200 in accordance with example embodiments.

Referring to FIGS. 1, 2, and 10, the cover 200 may cover the accommodation space S of the case 100. The cover 200 may be shaped as a box that has a rectangular parallelepiped structure with an opened lower surface. The cover 200 may be disposed on the case 100 to protect the semiconductor substrate 20 that is accommodated inside the case 100 from an outside. The cover 200 may be combined with or separated from the case 100. The cover 200 may have a cavity in which the case 100 is accommodated.

For example, the cover 200 may include a plastic material, e.g., polyethylene (PE), polypropylene (PP), polystyrene (PS), polyethylene terephthalate (PET), polyamides (PA), polyester (PES), polyvinyl chloride (PVC), polyurethanes (PU), polycarbonate (PC), polyvinylidene chloride (PVDC), and the like. In another example, the cover 200 may include a metal. The cover 200 may include a plastic material or a metal material that has strong hardness and high toughness.

When the case 100 is accommodated in the cavity of the cover 200, the cover 200 may protect the semiconductor substrate 20 that is accommodated inside the case 100 from an external impact. In a state that the case 100 is not accommodated, the cover 200 may be individually stored and managed. Since the case 100 has a rectangular parallelepiped structure, a plurality of the covers 200 may be stored in a stacked state.

Figure 11:
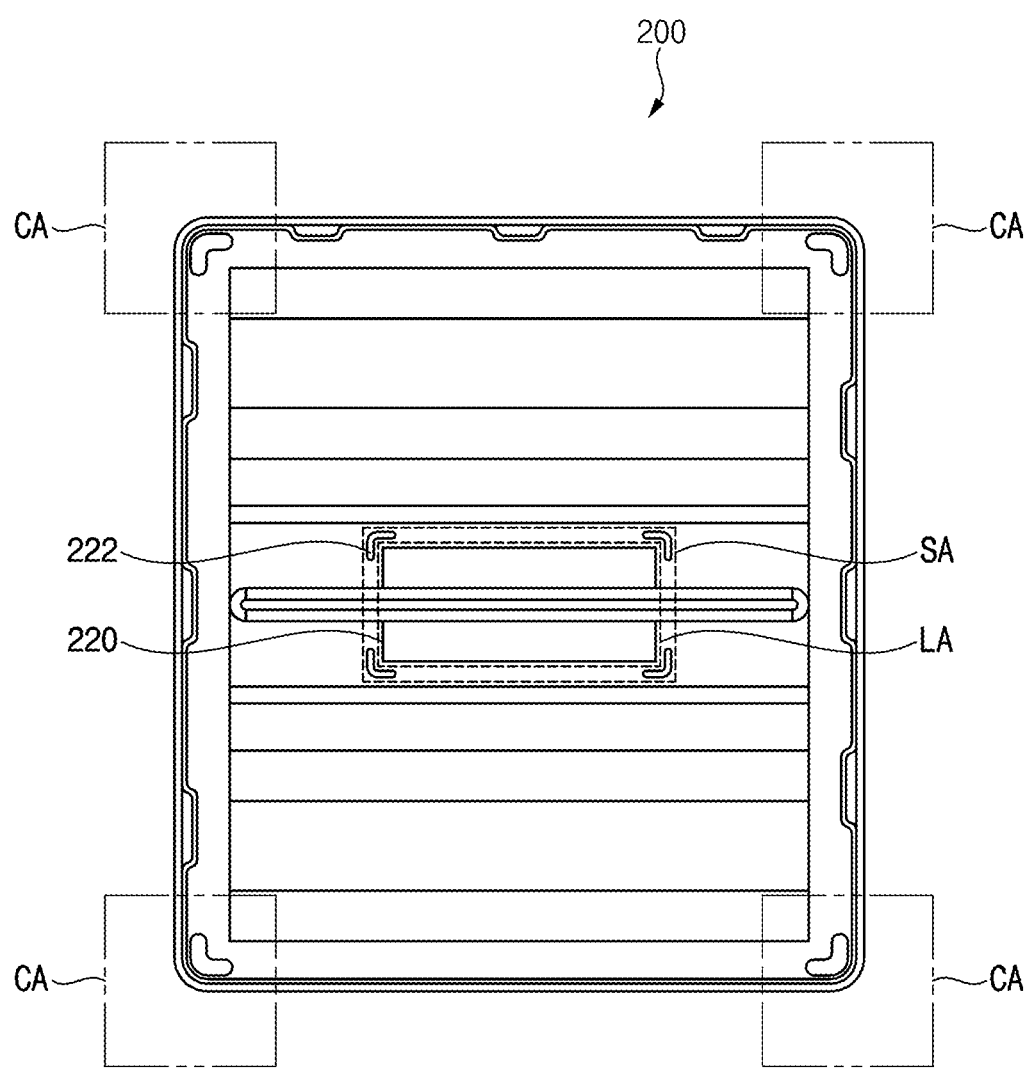
FIG. 11 is a plan view illustrating the cover in FIG. 10.
Figure 12:
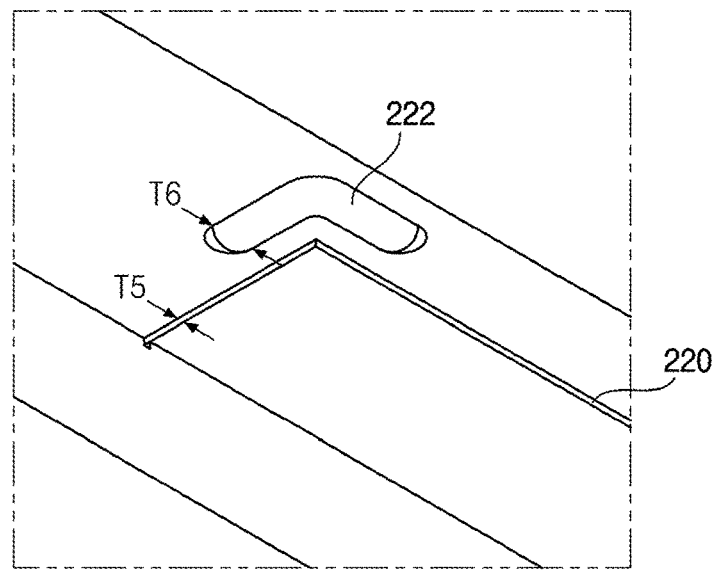
FIG. 12 is an enlarged perspective view illustrating portion 'C' in FIG. 10.
Figure 13:
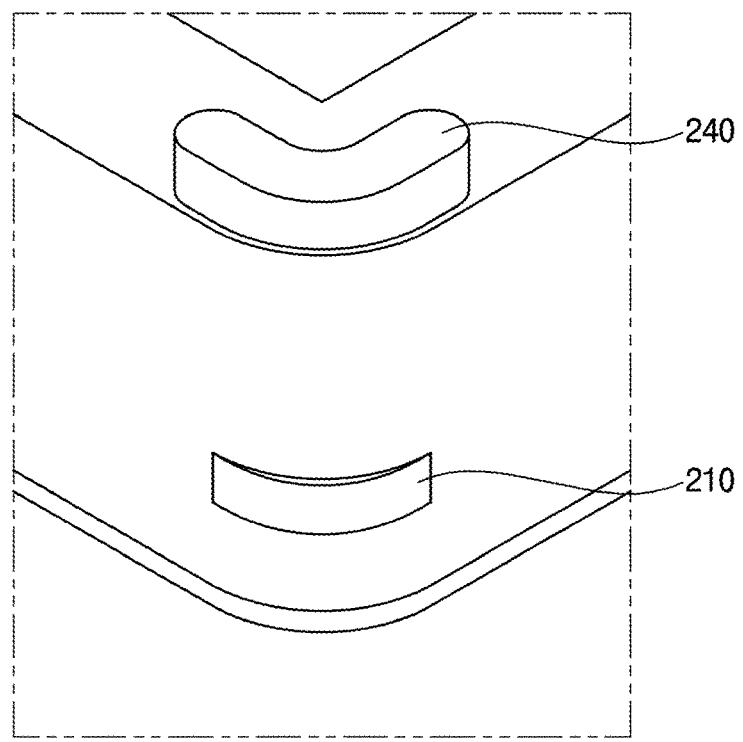
FIG. 13 is an enlarged perspective view illustrating portion 'D' in FIG. 10.

FIG. 11 is a plan view illustrating the cover in FIG. 10. FIG. 12 is an enlarged perspective view illustrating portion 'C' in FIG. 10, and FIG. 13 is an enlarged perspective view illustrating portion 'D' in FIG. 10.

Referring to FIGS. 11 and 12, the cover 200 may have a label attachment area LA on an outer surface, and a peripheral area SA that surrounds the label attachment area LA. The cover 200 may include a first intaglio 220 that is provided along the label attaching area LA on the outer surface, and a plurality of second intaglios 222 that are provided on respective corners of the peripheral area SA. The first intaglio 220 may have a fifth width T5, and each of the second intaglios 222 may have a sixth width T6 that is greater than the fifth width T5.

The first and second intaglios 220 and 222 may indicate a position to which a label is to be attached on the outer surface of the cover 200. A size of, e.g., shape and an area surrounded by, the first intaglio 220 may be the same as a size of the label. The first intaglio 220 may indicate an appropriate position to which the label is to be attached. The second intaglios 222 may indicate a maximum permissible range to which the label is capable of being attached.

For example, the fifth width T5 of the first intaglio 220 may be within a range of 0.1 mm to 3 mm. The sixth width T6 of the second intaglio 222 may be within a range of 1 mm to 5 mm. A horizontal length of the first intaglio 220 may be within a range of 100 mm to 150 mm. A vertical length of the first intaglio 220 may be within a range of 20 mm to 100 mm. A distance between adjacent ones of the second intaglios 222 may be within a range of 30 mm to 160 mm.

Referring to FIGS. 11 and 13, the cover 200 may further include a plurality of non-slip pads 240. The non-slip pads 240 may be provided to protrude from an outer surface at each of corner areas CA. For example, as illustrated in FIG. 10, the non-slip pads 240 may have an L-shape, and may protrude from an outer upper surface at each of corner areas CA. When other module tray 10 is stacked on the cover 200 in a state in which the case 100 and the cover 200 are combined, the non-slip pads 240 may support a lower surface of the other module tray 10, e.g., so the non-slip pads 240 may be between stacked module trays 10. For example, the case 100 may have a shape that corresponds to the non-slip pads 240 of the cover 200 such that the non-slip pads 240 may be combined or separated from the lower surface.

Figure 14:
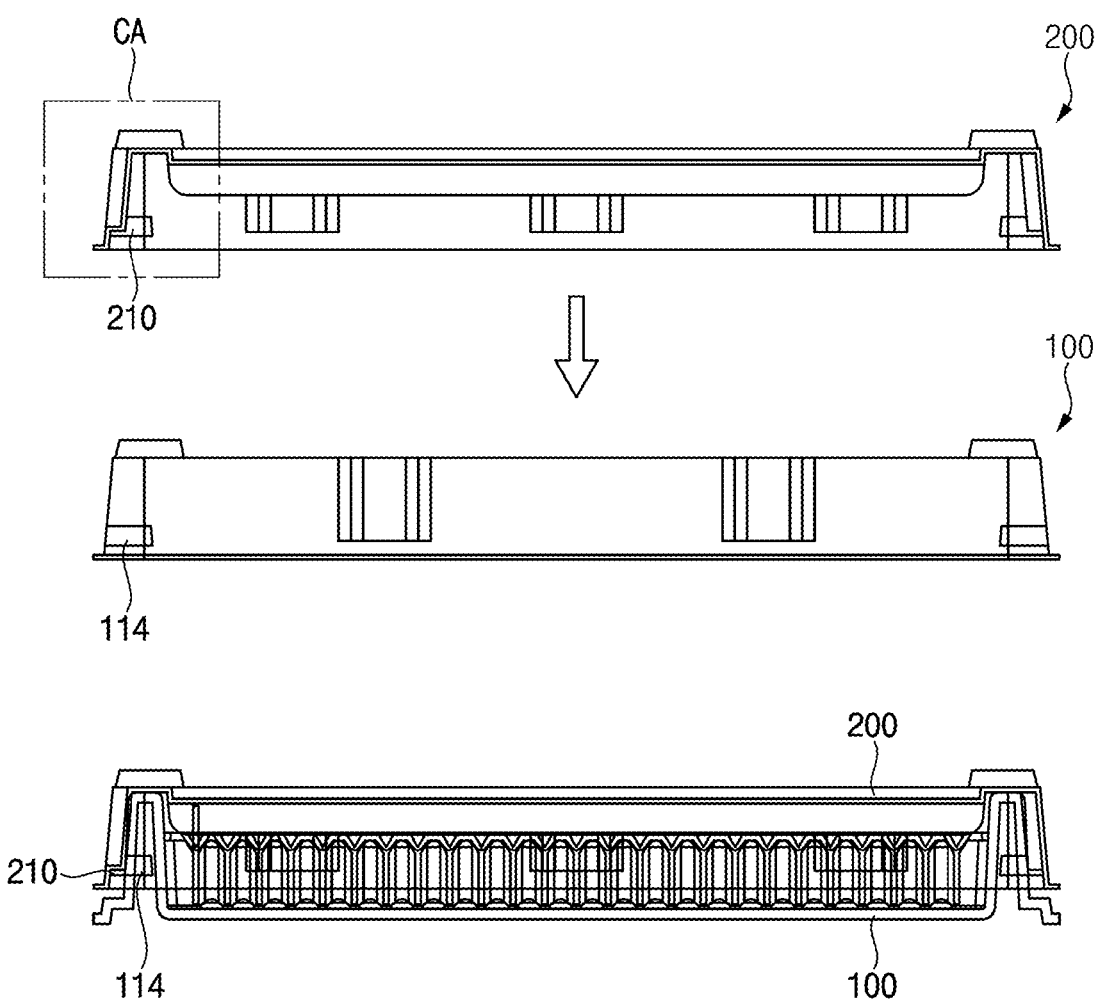
FIGS. 14 and 15 are views illustrating a process of combining a case and a cover of a module tray.
Figure 15:
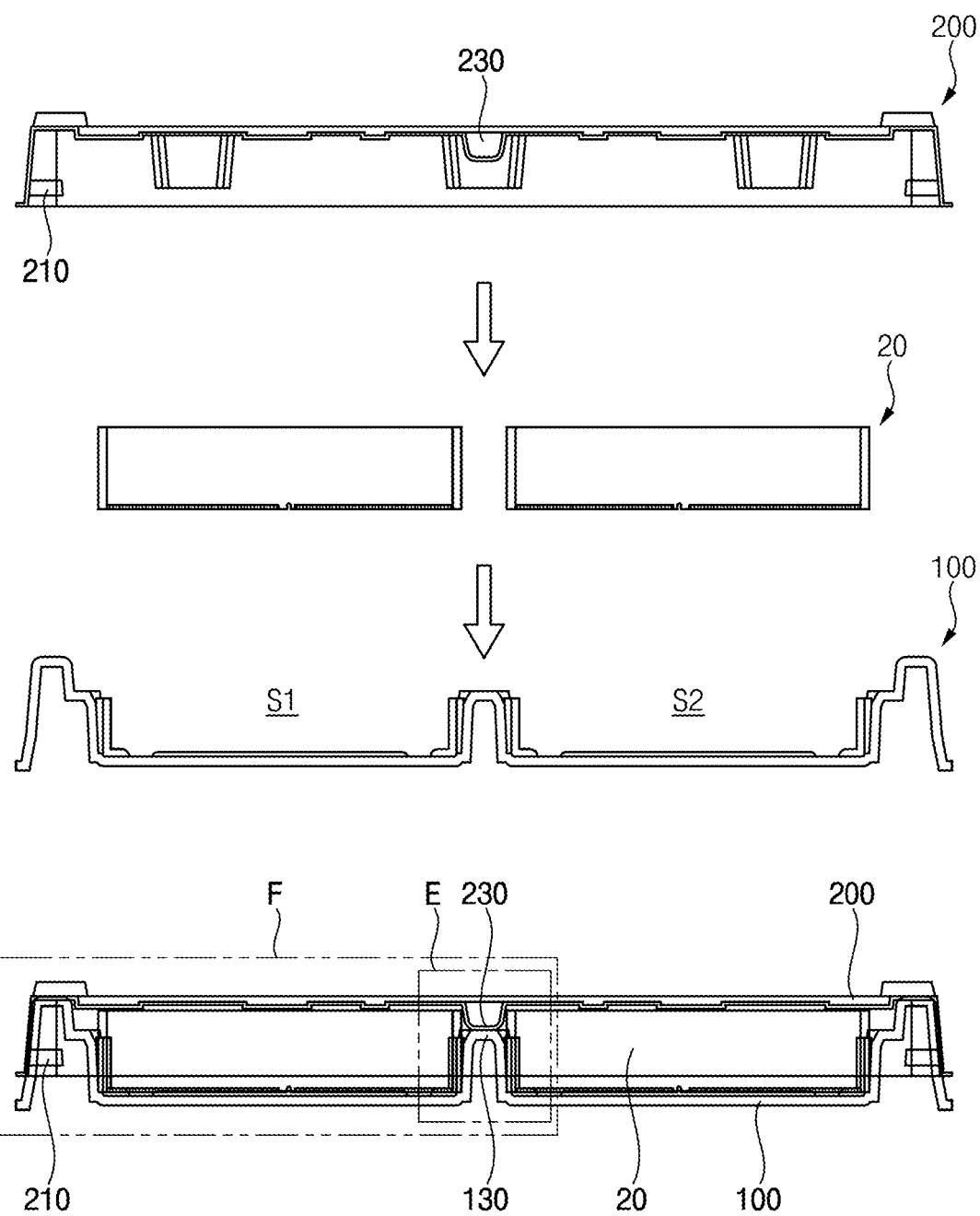
Figure 16:
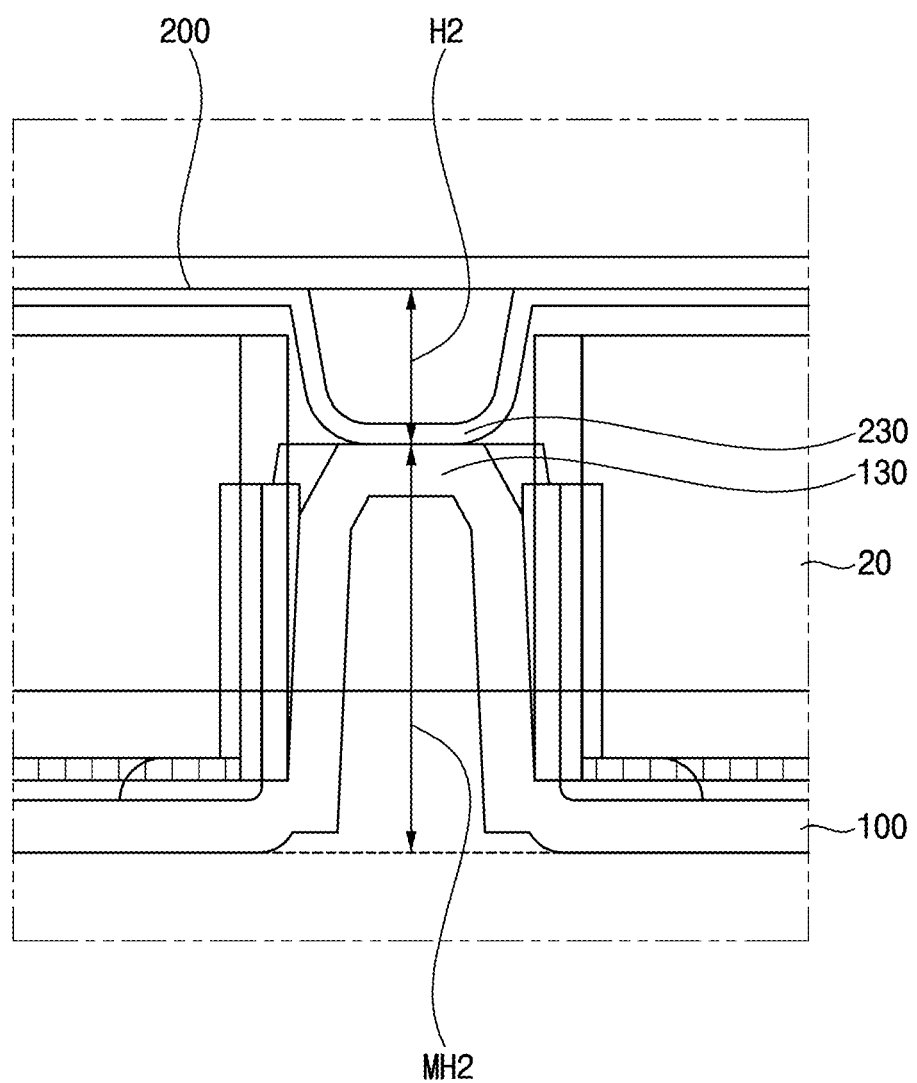
FIG. 16 is an enlarged cross-sectional view illustrating portion 'E' in FIG. 15.
Figure 17:
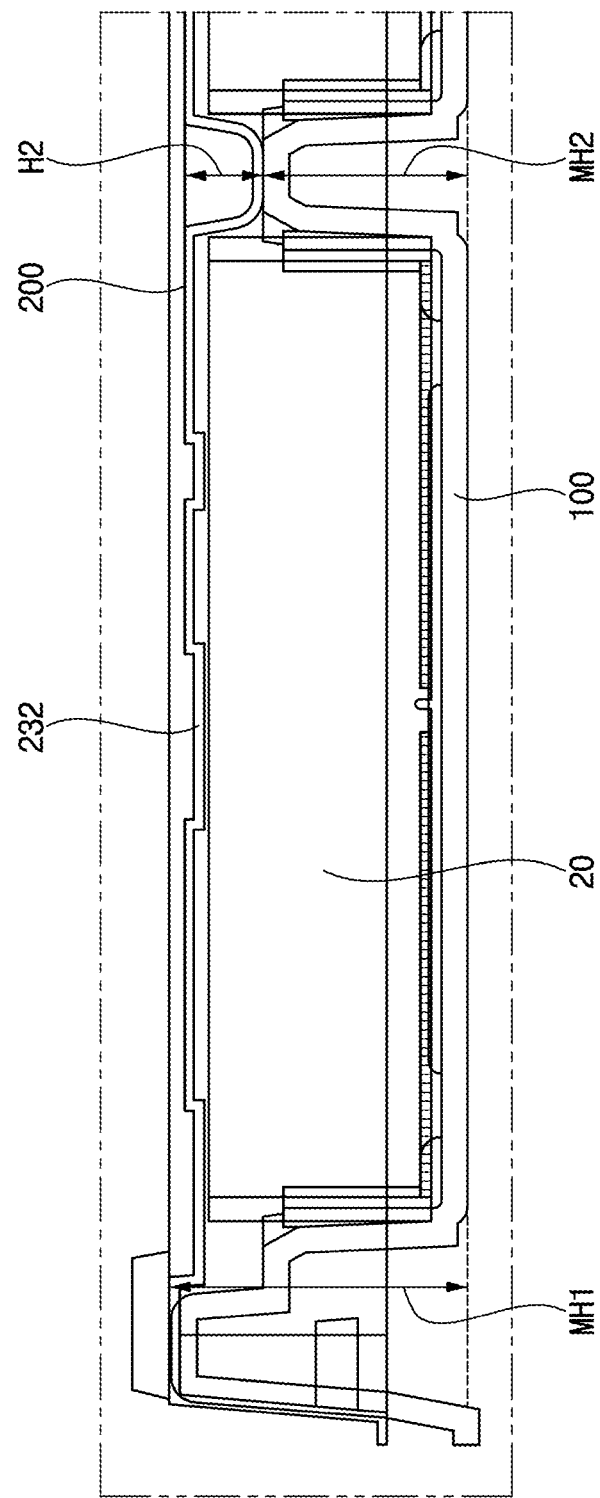
FIG. 17 is an enlarged cross-sectional view illustrating portion 'F' in FIG. 15.

FIGS. 14 and 15 are views illustrating a process of combining the case 100 and the cover 200 of the module tray 10. FIG. 16 is an enlarged cross-sectional view illustrating portion 'E' in FIG. 15. FIG. 17 is an enlarged cross-sectional view illustrating portion 'F' in FIG. 15.

Referring to FIGS. 14 to 17, the cover 200 may further include a plurality of the fixing protrusions 210 that protrude from the inner surface of the cover 200. The fixing protrusions 210 may be provided on the inner surface of the cover 200 at the corner areas CA. The cover 200 may further include a support portion 230 (FIG. 15) that protrudes from the inner surface of the cover 200 to support the case 100.

As illustrated in FIG. 14, the fixing protrusions 210 may be combined, e.g., combinable or attachable, with or separated from the fixing grooves 114 that are provided on the outer surface of the case 100. The fixing grooves 114 may be provided on the outer surface of the case 100 at positions that correspond to the fixing protrusions 210 on the cover 200. The case 100 and the cover 200 may be combined with or separated from each other through the fixing protrusions 210 and the fixing grooves 114.

As illustrated in FIG. 15, the support portion 230 of the cover 200 may contact the upper surface of the dividing wall 130 of the case 100. For example, as illustrated in FIG. 16, the support portion 230 may be provided on a bottom surface of the cavity, e.g., the support portion 230 may extend into a cavity defined above the dividing wall 130 and between semiconductor substrates 20 on opposite sides of the dividing wall 130. The support portion 230 may extend in the second horizontal direction from the inner surface of the cover 200 along the dividing wall 130 of the case 100.

As illustrated in FIGS. 15 to 17, the cover 200 may compensate for the difference that is between a first maximum height MH1 of each of the first and second sidewalls 110a and 110b from the base plate 102 and a second maximum height MH2 of the dividing wall 130 from the base plate 102. The support portion 230 may protrude from the inner surface of the cover 200 at a second height H2, e.g., to a depth H2 in the vertical direction. A difference between the first and second maximum heights MH1 and MH2 may be equal to the second height H2 of the support portion 230.

When the case 100 and the cover 200 are combined, the first and second sidewalls 110a and 110b may contact the inner surface of the cover 200, and the dividing wall 130 may not contact the inner surface of the cover 200. The support portion 230 of the cover 200 may support the dividing wall 130, e.g., so a combined height of the dividing wall 130 and the cover 200 may equal a height of each of the first and second sidewalls 110a and 110b, thereby preventing deformation of the upper surface of the cover 200 by an external force. The support portion 230 of the cover 200 may prevent an impact on the semiconductor substrate 20 from the external force.

In example embodiments, as illustrated in FIG. 17, the cover 200 may further include a protrusion portion 232 that protrudes from the inner surface, e.g., toward an upper surface of the semiconductor substrate 20. The protrusion portion 232 may support the semiconductor substrate 20 that is accommodated in the case 100. When the case 100 is shaken, the protrusion portion 232 may press and fix the semiconductor substrate 20 in the vertical direction.

The protrusion portion 232 may increase stress that is applied to the cover 200. The cover 200 may receive external forces in the first and second horizontal directions (e.g., the X and Y directions). The protrusion portion 232 may increase the stress by dispersing the external force that is applied to the cover 200.

The protrusion portion 232 may have a meander structure. The meander structure refers to a structure that extends in a zigzag pattern. The meander structure refers to a structure in which a unit in which the protrusion portion 232 proceeds in the zigzag pattern is repeated two or more times. The protrusion portion 232 may have a strong resistance against the external force that is applied in the first and second horizontal directions through the meander structure.

As described above, the module tray 10 for the semiconductor device may have an increased number of semiconductor substrates 20 that are accommodated in the accommodation space S by implementing the dividing wall 130 between the first and second sidewalls 110a and 110b. Since the number of the semiconductor substrates 20 in the accommodation space S increases, the first and second guide grooves 120a and 120b of the first and second sidewalls 110a and 110b and the third and fourth guide grooves 130a and 130b of the dividing wall 130 are implemented to safely guide the semiconductor substrates 20 to the first to fourth fastening guides 140a, 140b, 140c and 140d, respectively, thereby increasing stability and safety of the module tray. In addition, the module tray 10 may include the plurality of ribs 150, thereby preventing warpage of the semiconductor substrates 20.

Another module tray may be stably stacked on the upper surface of the module tray 10 through fixing grooves 114 that are provided on the outer surfaces of the first and second sidewalls 110a and 110b, respectively. The module tray 10 for the semiconductor device may more safely protect the semiconductor substrates 20 from the outside through the cover 200 that covers the accommodation space S through the fixing protrusions 210 that combined with or separated from the first and second sidewalls 110a and 110b, the first and second intaglios 220 and 222 that indicate the label attachment area, and the non-slip pads 240.

By way of summation and review, when an inner space of the module tray is small, collision may occur between the module tray and the semiconductor substrate while a worker inserts the semiconductor substrate into a slot inside the module tray and transports the module tray. Further, when a large number of semiconductor substrates are accommodated in one module tray, protection of the semiconductor substrate may be weakened In contrast, example embodiments provide a module tray for a semiconductor device having structures capable of protecting semiconductor substrates therein while increasing the number of accommodated semiconductor substrates.

That is, the module tray for the semiconductor device may increase the number of the semiconductor substrates that are accommodated in the accommodation space through the dividing wall provided between the first and second sidewalls. As the number of acceptable semiconductor substrates increases, protection of the semiconductor substrate may become weak. In a process of accommodating the semiconductor substrate in the accommodation space, the first and second guide grooves of the first and second sidewalls and the third and fourth guide grooves of the dividing wall may safely guide the semiconductor substrate to the first to fourth fastening guides, respectively. In addition, the module tray for the semiconductor devices may prevent warpage through a plurality of ribs. Another module tray may be stably stacked on an upper surface of the module tray through fixing grooves that are provided on outer surfaces of the first and second sidewalls, respectively. The module tray for the semiconductor device may more safely protect the semiconductor substrate from the outside through a cover that covers the accommodation space.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A module tray for a semiconductor device, the module tray comprising:
    a base plate;
    a first sidewall and a second sidewall extending in a vertical direction from opposite sides of the base plate to define an accommodation space;
    a dividing wall extending in the vertical direction from the base plate, the dividing wall being between the first and second sidewalls, and separating the accommodation space into a first accommodation space and a second accommodation space;
    first to fourth fastening guides provided on inner surfaces of the first and second sidewalls and opposite side surfaces of the dividing wall, respectively, the first to fourth fastening guides having first to fourth fastening grooves, respectively, and the first to fourth fastening grooves extending in the vertical direction to accommodate opposite ends of semiconductor substrates, respectively; and
    first to fourth guide grooves on the inner surfaces of the first and second sidewalls and the opposite side surfaces of the dividing wall, respectively, the first to fourth guide grooves having curved concave shapes to respectively guide the semiconductor substrates into the first to fourth fastening guides, respectively, and an upper end portion of each of the first to fourth fastening grooves gradually widening toward a top thereof.

2. The module tray as claimed in claim 1, wherein a number of each of the first to fourth fastening grooves is within a range of 20 to 30.

3. The module tray as claimed in claim 1, wherein the first to fourth guide grooves are above the first to fourth fastening grooves, respectively.

4. The module tray as claimed in claim 1, wherein each of the first to fourth guide grooves includes a half funnel shape that narrows toward each of the first to fourth fastening grooves.

5. The module tray as claimed in claim 1, wherein an upper end portion of each of the first to fourth guide grooves has an inner surface that inclines at a predetermined angle with respect to the vertical direction, the predetermined angle being within a range of 20 degrees to 40 degrees.

6. The module tray as claimed in claim 1, further comprising ribs protruding from surfaces of the first to fourth fastening guides, respectively, the ribs extending in the vertical direction from an upper surface of the base plate.

7. The module tray as claimed in claim 1, wherein:
    the first sidewall further includes a first number of first reinforcing grooves that are on an outer surface of the first sidewall, and
    the second sidewall further includes a second number of second reinforcing grooves that are on an outer surface of the second sidewall, the second number being different from the first number.

8. The module tray as claimed in claim 1, further comprising a cover detachably fastened on the first and second sidewalls to cover the accommodation space.

9. The module tray as claimed in claim 8, wherein:
    each of the first and second sidewalls further includes fixing grooves on an outer surface thereof, and
    the cover further includes fixing protrusions protruding from an inner surface thereof, the fixing protrusions being combinable with the fixing grooves, respectively.

10. The module tray as claimed in claim 8, wherein the cover further includes:
    a first intaglio on an upper surface thereof along a label attachment area; and
    second intaglios on respective corners of a peripheral area that surrounds the label attachment area.

11. The module tray as claimed in claim 10, wherein the first intaglio has a first width, and each of the second intaglios has a second width greater than the first width.

12. The module tray as claimed in claim 8, wherein the cover further includes a support portion protruding from a surface thereof and contacting the dividing wall, a height of the support portion being equal to a height difference between the dividing wall and each of the first and second sidewalls as measured from the base plate.

13. The module tray as claimed in claim 8, wherein the cover further includes non-slip pads protruding from upper surfaces of corner regions, respectively.

14. A module tray for a semiconductor device, the module tray comprising:
    a case having an accommodation space to accommodate semiconductor substrates, the case including:
        a base plate,
        a first sidewall and a second sidewall extending in a vertical direction from opposite sides of the base plate to define the accommodation space,
        a dividing wall extending in the vertical direction from the base plate between the first and second sidewalls to separate the accommodation space,
        first to fourth fastening guides on opposite side surfaces of the dividing wall and inner surfaces of the first and second sidewalls, respectively, the first to fourth fastening guides extending in the vertical direction to accommodate opposite ends of respective ones of the semiconductor substrates, and the first to fourth fastening guides respectively having first to fourth fastening grooves that gradually widen toward their respective tops; and first to fourth guide grooves on the opposite side surfaces of the dividing wall and the inner surfaces of the first and second sidewalls, the first to fourth guide grooves having curved concave shapes to guide the semiconductor substrates into the first to fourth fastening guides, respectively; and a cover detachably fastened on the case to cover the accommodation space.

15. The module tray as claimed in claim 14, wherein each of the first to fourth guide grooves includes a half funnel shape that narrows toward each of the first to fourth fastening grooves.

16. The module tray as claimed in claim 14, wherein:

the first sidewall further includes a first number of first reinforcing grooves on an outer surface of the first sidewall, and the second sidewall further includes a second number of second reinforcing grooves on an outer surface of the second sidewall, the second number being different from the first number.

17. The module tray as claimed in claim 14, wherein each of the first and second sidewalls further includes fixing grooves on an outer surface thereof, the cover further including fixing protrusions protruding from an inner surface thereof and being combinable with the fixing grooves, respectively.

18. The module tray as claimed in claim 14, wherein the cover further includes:

a first intaglio on an upper surface thereof along a label attachment area; and second intaglios on respective corners of a peripheral area that surrounds the label attachment area.

19. The module tray as claimed in claim 14, wherein the cover further includes a support portion protruding from a surface thereof and contacting the dividing wall, a height of the support portion being equal to a height difference between the dividing wall and each of the first and second sidewalls from the base plate.

20. A module tray for semiconductor device, the module tray comprising:

a case having an accommodation space configured to accommodate semiconductor substrates, the case including:

a base plate, a first sidewall and a second sidewall extending in a vertical direction from the base plate, the first and second sidewalls having respective first and second guide grooves with curved concave shapes on upper surfaces thereof to guide the semiconductor substrates into the accommodation space, a dividing wall extending in the vertical direction from the base plate between the first and second sidewalls to separate the accommodation space, the dividing wall having third and fourth guide grooves with curved concave shapes on upper surface thereof to guide the semiconductor substrates into the accommodation space, respectively, and first to fourth fastening guides on opposite surfaces of the dividing wall and inner surfaces of the first and second sidewalls, respectively, the first to fourth fastening guides extending in the vertical direction to accommodate opposite ends of each of the semiconductor substrates, the first to fourth fastening guides respectively having first to fourth fastening grooves that gradually widen toward tops thereof, wherein the first sidewall includes a first number of first reinforcing grooves on an outer surface of the first sidewall, and first fixing grooves, wherein the second sidewall includes a second number of second reinforcing grooves on an outer surface of the second sidewall, and second fixing grooves, the second number being different from the first number; and a cover detachably fastened on the case to cover the accommodation space, the cover including:

first and second fixing protrusions protruding from an inner surface thereof and fastened to the first and second fixing grooves, respectively;

a first intaglio on an upper surface along a label attachment area, second intaglios on respective corners of a peripheral area that surrounds the label attachment area, and a support portion protruding from a surface of the cover to contact the dividing wall, a height of the support portion being equal to a height difference between the dividing wall and each of the first and second sidewalls from the base plate.

* * * * *